United States Patent [19]

Yonezawa et al.

[11] Patent Number: 5,457,874
[45] Date of Patent: Oct. 17, 1995

[54] MOUNTING APPARATUS OF ELECTRONIC COMPONENT

[75] Inventors: Takahiro Yonezawa, Neyagawa; Wataru Hirai, Hirakata; Muneyoshi Fujiwara, Katano; Kunio Sakurai, Sakai; Naohiko Chimura, Osaka; Hiroshi Ohta, Moriguchi, all of Japan

[73] Assignee: Matsushita Electric Industrial Co., Ltd., Osaka, Japan

[21] Appl. No.: 174,359

[22] Filed: Dec. 28, 1993

[30] Foreign Application Priority Data

Dec. 28, 1992 [JP] Japan ................................ 4-348053

[51] Int. Cl.⁶ ........................... B23P 19/04; H05K 3/32
[52] U.S. Cl. ........................... 29/743; 29/740; 29/741; 29/DIG. 44
[58] Field of Search .................... 29/739, 740, 741, 29/743, 759, 832, DIG. 44; 279/3; 414/752, 737

[56] References Cited

U.S. PATENT DOCUMENTS

| | | | |
|---|---|---|---|
| 4,372,802 | 2/1983 | Harigane et al. | 29/743 X |
| 4,631,816 | 12/1986 | Fujita et al. | 29/740 |
| 4,706,379 | 11/1987 | Seno et al. | 29/740 |
| 4,905,370 | 3/1990 | Hineno et al. | 29/759 X |

FOREIGN PATENT DOCUMENTS

| | | | |
|---|---|---|---|
| 62598 | 3/1991 | Japan | 29/743 |
| 188700 | 7/1992 | Japan | 29/743 |
| 345097 | 12/1992 | Japan | 29/743 |

*Primary Examiner*—Peter Vo
*Attorney, Agent, or Firm*—Wenderoth, Lind & Ponack

[57] ABSTRACT

A mounting apparatus for mounting electronic components, includes a component feeding section wherein plural component feeding units accommodating plural components and sequentially supplying components to a predetermined component take-out position are arranged on a moving table along a moving direction, a positioning mechanism of a mounting member to which one component is to be mounted, and a mounting device for holding one component at a predetermined position in the feeding section and mounting the component onto the mounting member. The mounting device includes a movable member which is vertically movable and has a gas groove which is formed at an inside part of the movable member, and a rotary member which is rotatable around a vertical axis of the movable member and has at its inside part a gas groove which is formed at an inside part of the rotary member and is communicated with the groove of the movable member so as to transmit gas between the grooves during operation. The mounting device also includes a pressure gas transmitting member having positive and negative pressure holes of gas passages formed at its inside, and a gas switching member having a gas groove communicating with a suction passage of a suction member for sucking the component. The switching member is movable to selectively switch between states where the suction passage is communicated with the positive pressure hole and the negative pressure hole, respectively.

12 Claims, 8 Drawing Sheets

NEGATIVE PRESSURE

POSITIVE PRESSURE

Fig.13 - PRIOR ART 5,457,874

MOUNTING APPARATUS OF ELECTRONIC COMPONENT

BACKGROUND OF THE INVENTION

The present invention relates to a mounting apparatus used for mounting electronic components fed from a component feeding section to a mounting member, such as a circuit board, to which the components are mounted.

In a conventional mounting apparatus of the type referred to above, a plurality of component feeding units containing electronic components are aligned side by side on a moving table at a component feeding section, and the components are taken out (removed) at predetermined positions by moving the moving table in an aligning direction. The circuit board, specifically, a component of the circuit substrate where the components are mounted, is positioned at a predetermined position by a positioning means while the positional shift of the components held by a mounting means is recognized and corrected by a recognizing means. Accordingly, the components are correctly mounted on the circuit board.

For the mounting means, as shown in FIGS. 11 and 12, a rotatable rod 43 is set in a housing 42 which is supported by a linear slide 41 in a movable fashion in the up-and-down direction, and a suction nozzle 44 for sucking and holding an electronic component 45 is provided at the lower end of the rod 43. An air switching valve 46 at the side face of the housing 42 is effective to switch between providing the suction nozzle 44 with negative pressure air for suction and holding of component 45, and positive pressure air for mounting the component 45 on the circuit board. Air pipes 47 are connected to the switching valve 46 to feed or suck the air.

As in FIG. 13, the air switching valve 46 is generally comprised of a spool 46a, pressure switching levers 46b, 46c, and a spring 46d for urging the switching levers 46b, 46c toward one another.

In order to mount the components at high speeds with high accuracy using the above-described conventional mounting apparatus, the mounting means should be made compact in size and light in weight and moreover arranged with a narrow pitch to reduce the moving distance, to thereby lessen the centrifugal force or acceleration/deceleration force acting on the components.

However, the mounting means of the above constitution has difficulty in meeting the requirements. That is, since the air pipes 47 are present and moreover, the stroke of the housing 42 in the up-and-down direction requires the air pipes 47 to be relatively long, the air pipes 47 disadvantageously interfere with the component 45 held by the nozzle 44 adjacent to the air pipes 47, thus causing positional shifting of the component 45 or resulting in the breakage of the pipes 47. If the air pipes 47 are broken, the air is not properly fed and therefore, the component cannot be held correctly or is shifted in position. Furthermore, due to the disposition of the air switching valve 46 which is a separate body in the complicated structure, it is difficult to make the mounting means compact and light-weight.

SUMMARY OF THE INVENTION

The object of the present invention is therefore to provide a mounting apparatus and a mounting means for electronic components which can dispense with gas pipes of a mounting means, and can utilize a positive/negative pressure switching section which is compact, to thereby realize the miniaturization and lightening of the mounting means.

In accomplishing these and other objects, according to a first aspect of the present invention, there is provided a mounting apparatus for mounting electronic components, comprising: a component feeding section wherein a plurality of component feeding units accommodating a plurality of components and sequentially supplying the components to a predetermined component take-out position are arranged on a moving table along a moving direction; a positioning means of a mounting member to which one of the components is to be mounted; and a mounting means for holding one of the components at a predetermined position in the component feeding section and mounting the component onto the mounting member. The mounting means comprises: a movable member which is movable in a vertical direction and has a gas groove which is formed at an inside part of the movable member; and a rotary member which is rotatable around an axis along the vertical direction of the movable member and has at its inside part a gas groove which is formed at an inside part of the rotary member and is communicated with the gas groove of the movable member so as to transmit gas between the gas grooves during operation.

According to a second aspect of the present invention, there is provided a mounting means for holding an electronic component at a predetermined position in a component feeding section and mounting the component onto a mounting member to which the component is mounted. The mounting means comprises: a movable member which is movable in a vertical direction and has a gas groove which is formed at an inside part of the movable member; and a rotary member which is rotatable around a vertical axial center and has at its inside part a gas groove which is formed at an inside part of the rotary member and is communicated with the gas groove of the movable member so as to transmit gas between the gas grooves during operation.

According to a third aspect of the present invention, there is provided a mounting apparatus for mounting electronic components, comprising: a component feeding section wherein a plurality of component feeding units accommodating a plurality of components and sequentially supplying the components to a predetermined component take-out position are arranged on a moving table along a moving direction; a positioning means of a mounting member to which one of the components is to be mounted; and a mounting means for holding one of the components at a predetermined position in the component feeding section and mounting the component onto the mounting member. The mounting means comprises: a pressure gas transmitting member having a positive pressure hole and a negative pressure hole of gas passages formed at its inside; and a gas switching member which has a gas groove communicating with a suction passage of a suction member for sucking the component and which is movable to selectively switch between states where the suction passage is communicated with the positive pressure hole and where the suction passage is communicated with the negative pressure hole in accordance with movement of the switching member.

According to a fourth aspect of the present invention, there is provided a mounting means for holding an electronic components at a predetermined position in a component feeding section and mounting the component onto a mounting member to which the component is mounted. The mounting means comprises: a pressure gas transmitting member having a positive pressure hole and. a negative pressure hole of gas passages formed at its inside; and a gas switching member which has a gas groove communicating with a suction passage of a suction member for sucking the component and which is movable to selectively switch between states where the suction passage is communicated with the positive pressure hole and where the suction passage is communicated with the negative pressure hole in accordance with movement of the switching member.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
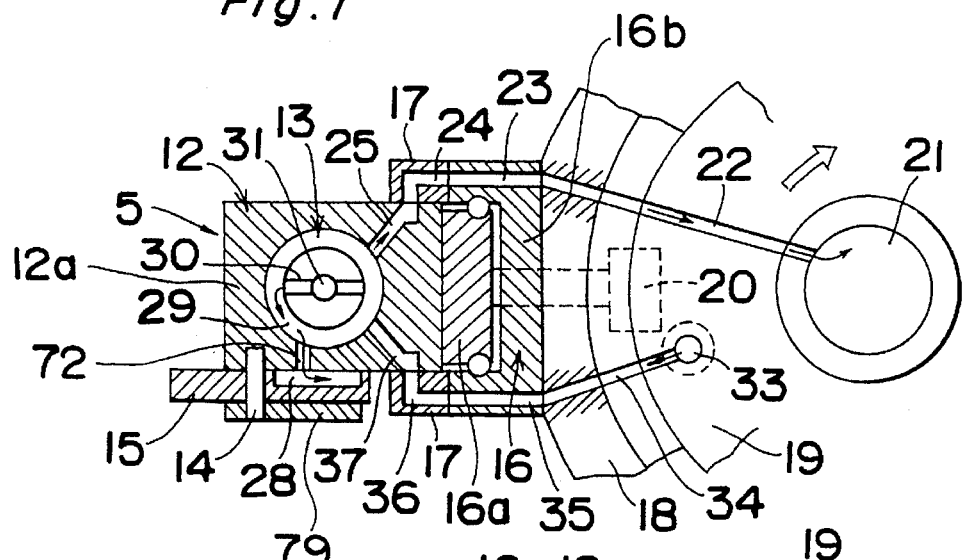
FIGS. 1 and 2 are respectively transverse sectional views taken along the lines I—I and II—II in FIG. 3 of a mounting means in an electronic component mounting apparatus according to a preferred embodiment of the present invention.

Before the description of the present invention proceeds, it is to be noted that like parts are designated by like reference numerals throughout the accompanying drawings.

A mounting apparatus of electronic components according to a preferred embodiment of the present invention will be described with reference to FIGS. 1–10 and 14.

Figure 10:
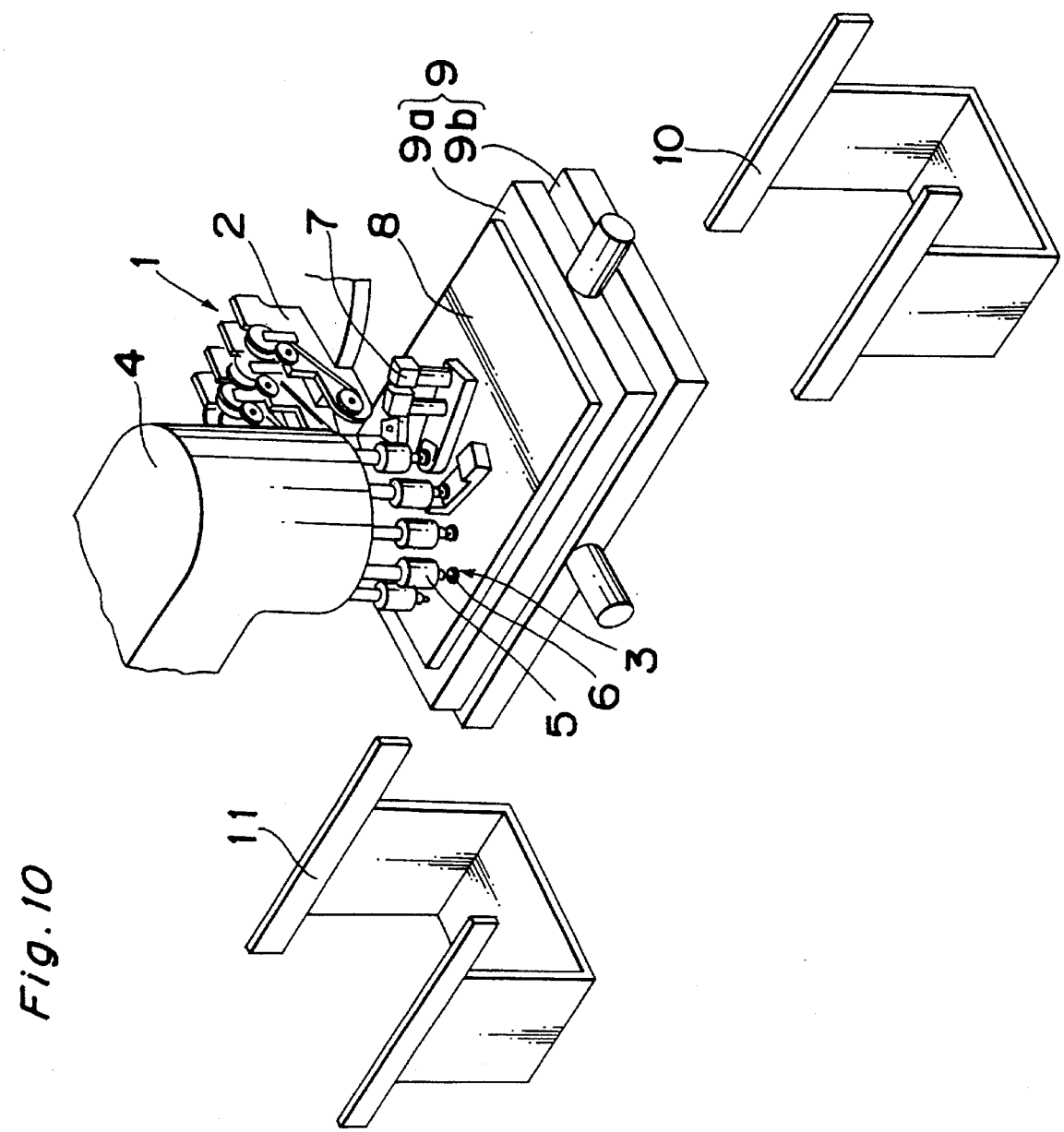
FIG. 10 is a perspective view of the whole of the apparatus in the preferred embodiment.
Figure 11:
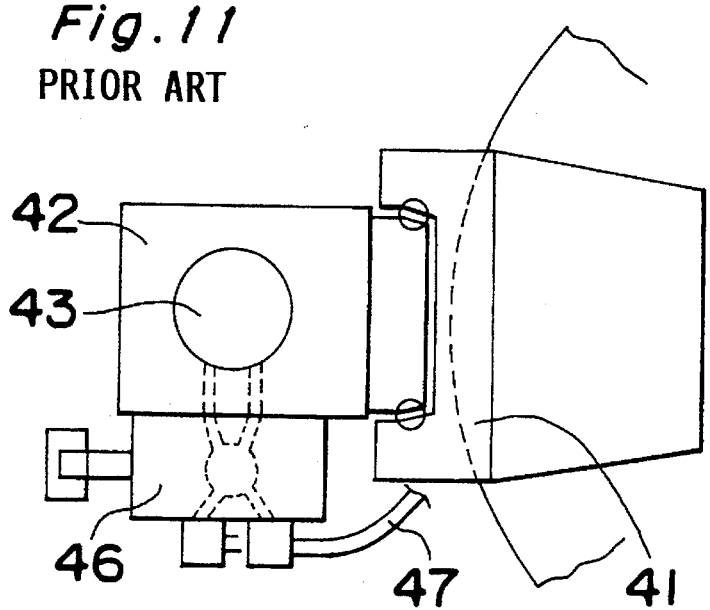
FIG. 11 is a plan view of a mounting means of a conventional electronic component mounting apparatus.
Figure 12:
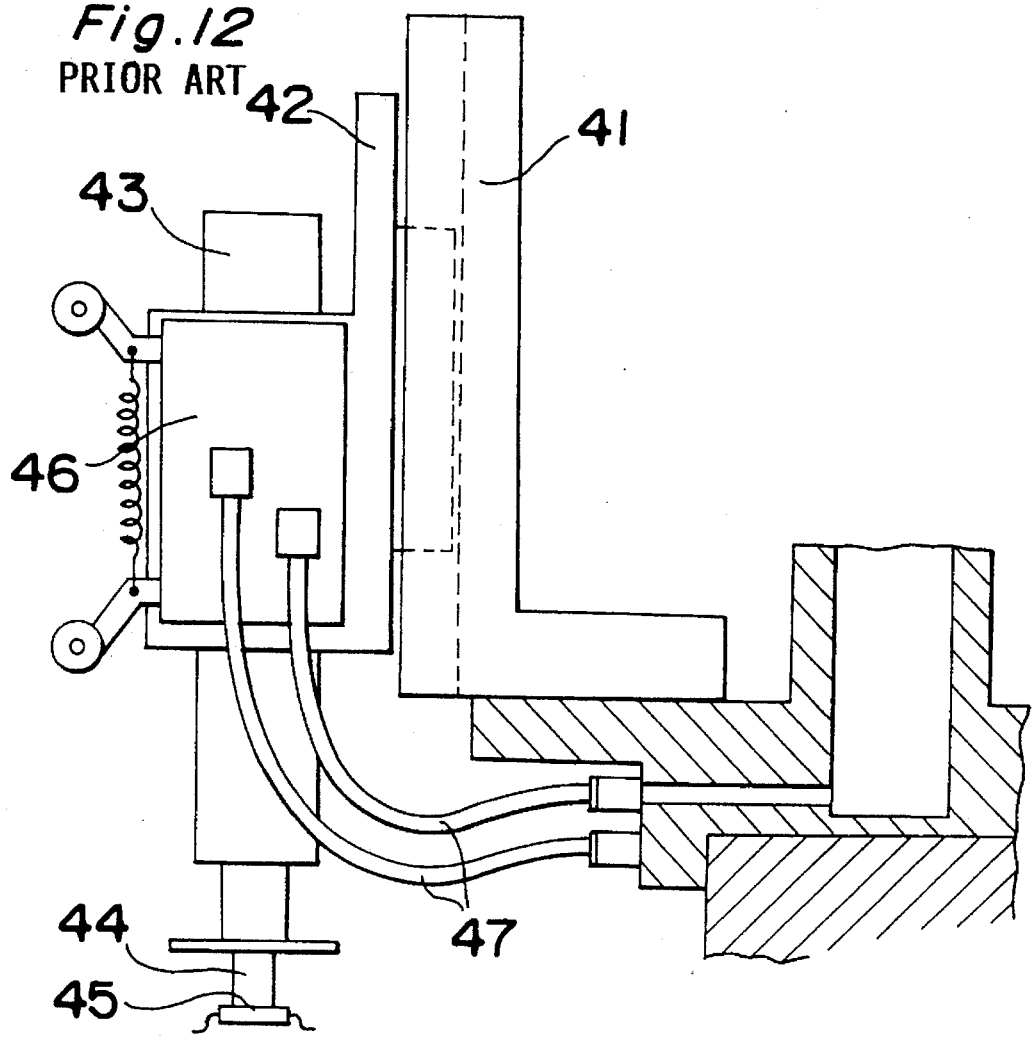
FIG. 12 is a partially sectional front view of the mounting means of FIG. 11.
Figure 13:
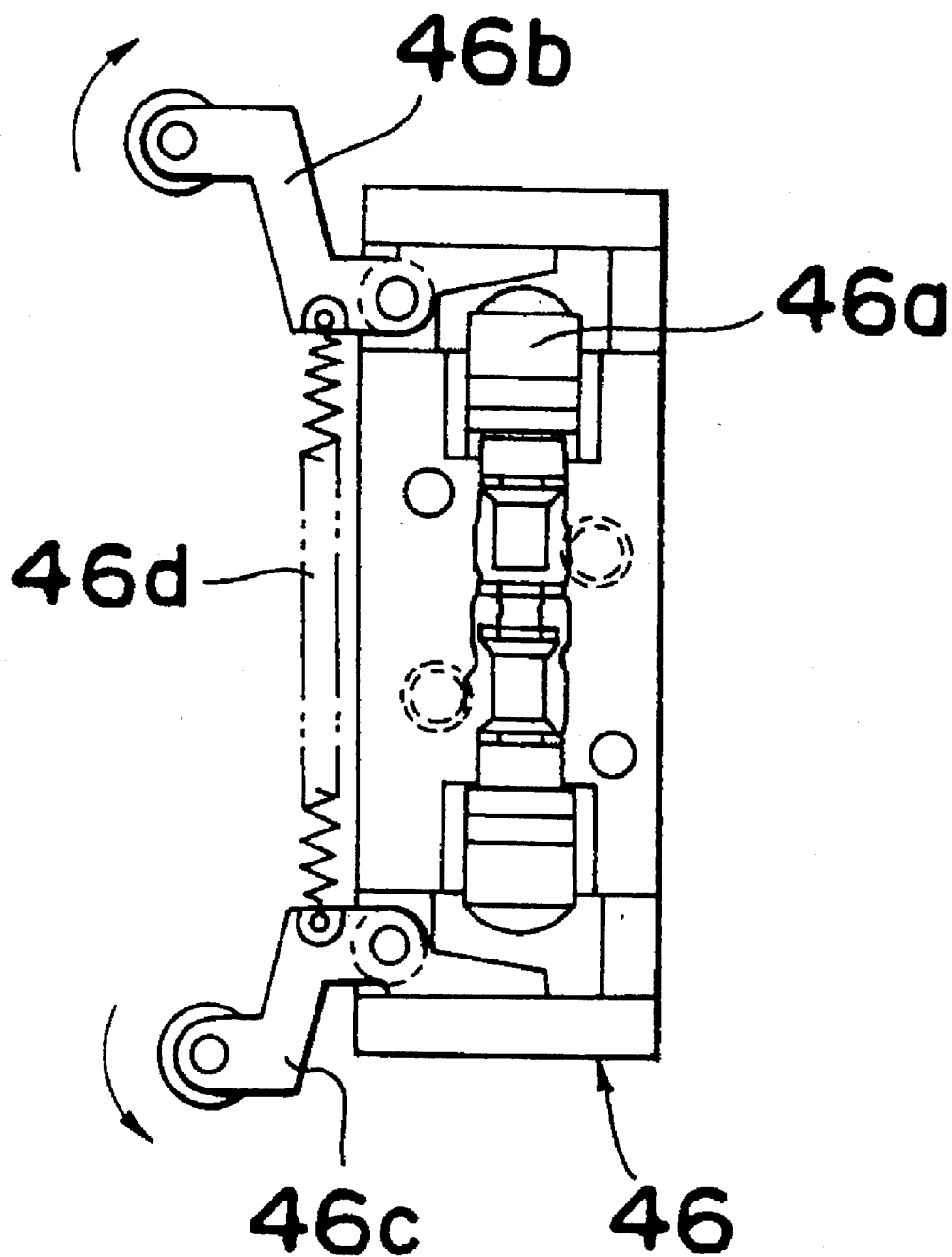
FIG. 13 is a front view of an air switching valve in the apparatus of FIG. 11.

In FIG. 10, many component feeding units 2 are arranged side by side at a component feeding section 1 in such a manner that any of the feeding units 2 can be positioned at a predetermined feeding position. A tape-like assembly holding many components 3 in a row is set in the component feeding unit 2. The components 3 are sequentially sent out to a component removal position located at one end of the component feeding unit.

A turning-type mounting unit 4 has a plurality of mounting heads 5 equally spaced on a rotary table which is intermittently rotatable around a fixed shaft. The rotary table is rotated intermittently by the interval between the adjacent mounting heads 5. Therefore, the stopping position of the mounting head 5 is set at the component feeding position and the component mounting position.

The mounting head 5 is movable up and down. After the mounting head 5 is lowered at the component feeding position to suck the component 3 by means of a suction nozzle 6, the mounting head 5 is raised. The amount of the positional shift at the suction position of the component 3 is recognized by a component suction position recognizing section 7. The suction nozzle 6 is rotated by a nozzle rotating means while the positional shift of the component 3 is adjusted to satisfy the predetermined mounting angle. Then, the mounting head 5 is moved down again at the component mounting position, and releases the suction of the component 3. As a result, the component 3 is mounted on a circuit board 8. Thereafter, the mounting head 5 is moved up and the suction nozzle 6 is returned to the original point by a nozzle returning means (not shown). If the suction opening of the suction nozzle 6 is likely to be clogged by dust or the like, gas such as air at positive pressure is fed to the suction nozzle 6 by a nozzle cleaner (not shown) to blow away the dust, etc. from the suction opening. The dust, etc. is collected by a dust collecting means (not shown).

The circuit board 8 on which the component 3 is mounted is positioned by a positioning unit 9. A fixing means for securely supporting the circuit board 8 carried in by a carrier means 10 is placed on an X-table 9a which is movable in the X-direction. The X-table 9a is set on a Y-table 9b which is movable in the Y-direction. Therefore, a desired point or position of the supported circuit board 8 can be positioned at the component mounting position. A carry-out means 11 carries out (discharge) the completed circuit board 8.

Now, the structure of the mounting head 5 will be depicted with reference to FIGS. 1–9 and 14.

Figure 14:
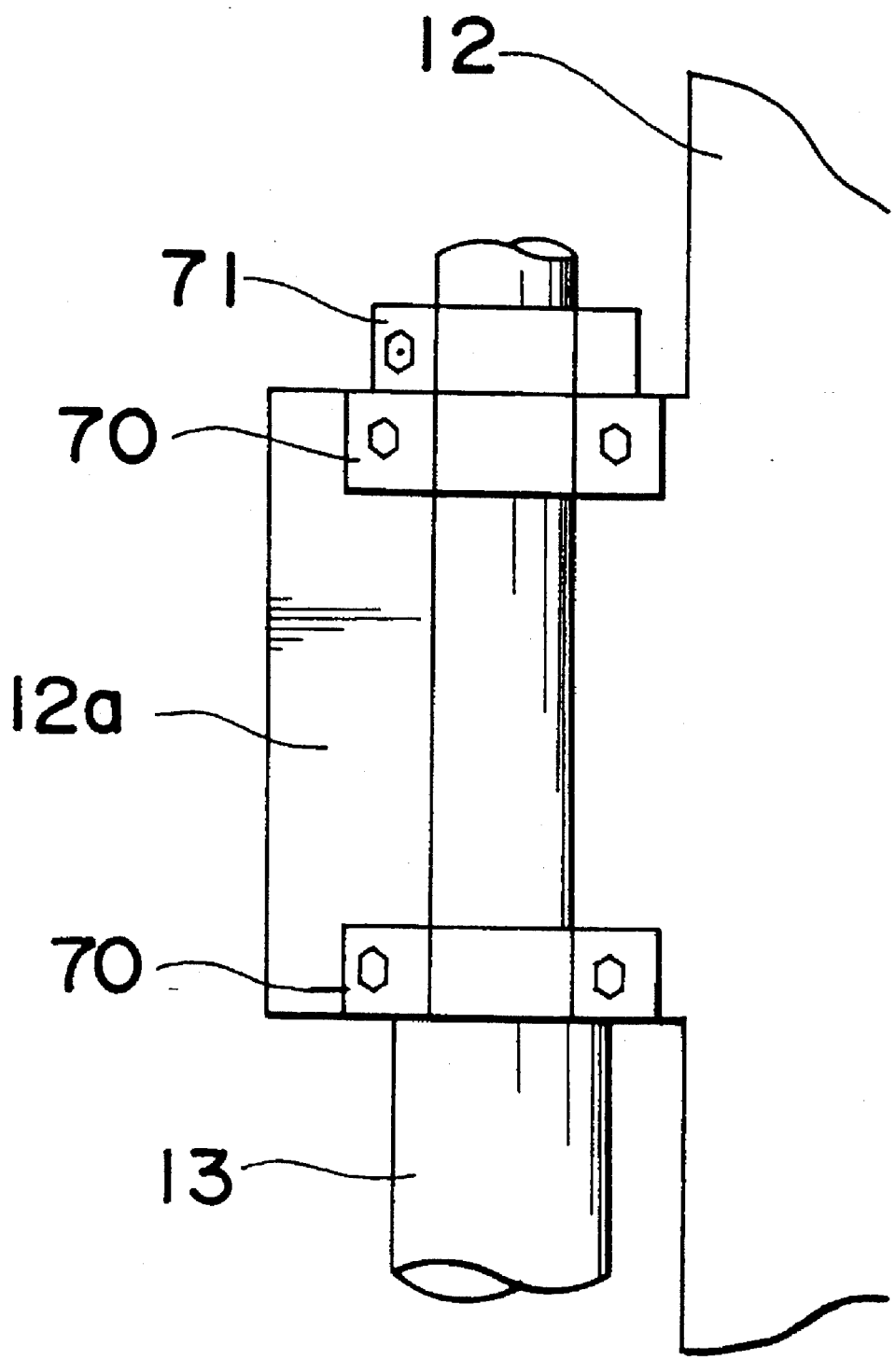
FIG. 14 is a side view showing the relationship between a housing and a rod in the mounting means of FIG. 1.

In FIG. 1, a projection part 12a of a housing 12 of the mounting heads 5 serving as a movable part and a pressure gas transmitting member, supports a rod 13 by upper and lower bearings 70 in the rotatable fashion as shown in FIG. 14. The rod 13 is prevented from dropping out of the housing 12 by a stopper 71 and is fixed to the suction nozzle 6. A switching lever 15 is mounted at the side face of the projection part 12a of the housing 12 so as to be rotatable around a pin 14. Reference numeral 79 denotes a cover of the switching lever 15. The switching lever 15 is rotated and switched when either first or second lever 73 or 74 shown in FIGS. 8 and 9 comes in contact with the switching lever 15. The rotating region of the switching lever 15 is determined by a spring pin (not shown). A linear guide 16 has a movable part 16a fixed to the housing 12 which can move against a fixed part 16b. Accordingly, the housing 12 is movable up and down against a rotary table 18. Two air transmission plates 17 are secured to the fixed part 16b of the linear guide 16 and transmit the air between the linear guide 16 and the housing 12.

The rotary table 18 is set on an index drive (not shown) which is intermittently rotatable around a fixed shaft. A grooved cam is formed in the peripheral direction of a cylindrical cam 19, into which a cam follower 20 secured to the movable part 16a of the linear guide 16 is fitted. Then, the cylindrical cam 19 is moved up and down in a predetermined manner in accordance with the rotation of the rotary table 18.

The flow of the air will be first described. Referring to the flow at the vacuum suction side, a vacuum pump (not shown) is communicated with a vacuum hole 21 at the axial center of the rotary table 18 through the interior of a cylindrical output shaft of the index drive (not shown). The axial center of the vacuum hole 21 is the axial center of the rotary table 18. There are formed in the rotary table 18 air passages 22 extending in the radial direction from the vacuum hole 21 and corresponding to each mounting head 5. The air passages 22 are connected to corresponding air passages 23 formed in the linear guide 16.

Figure 4:
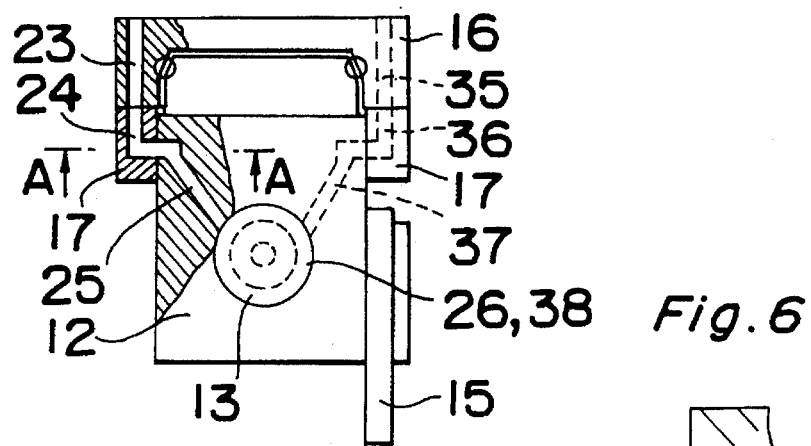
FIG. 4 is a partially sectional plan view of an air passage of the apparatus in the preferred embodiment.
Figure 5:
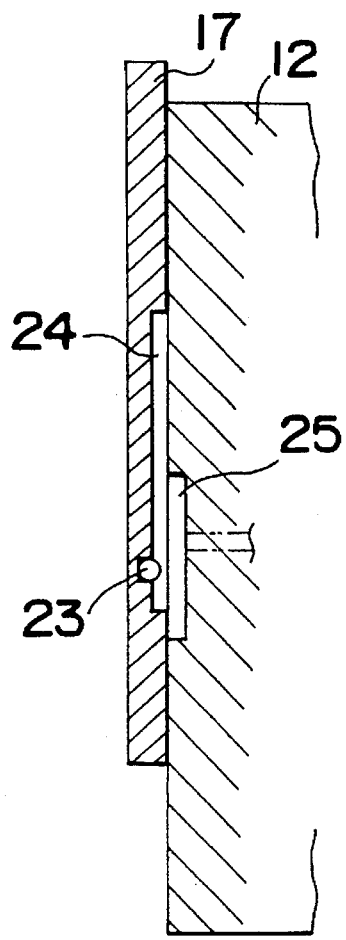
FIG. 5 is a sectional view taken along the line A—A of FIG. 4.
Figure 6:
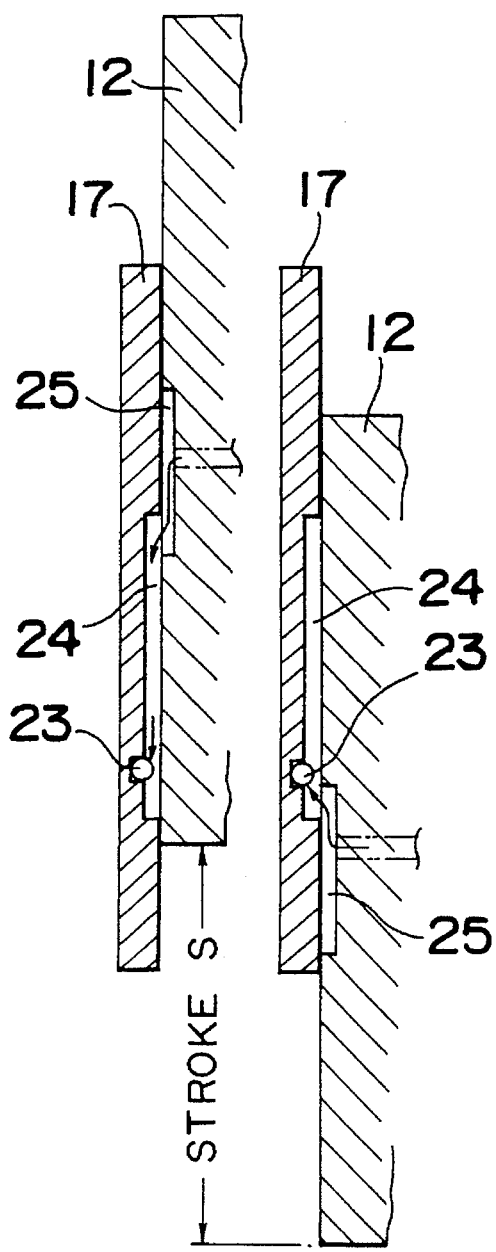
FIG. 6 is a sectional view similar to FIG. 5, explaining the stroke between the upper limit and the lower limit during operation.
Figure 7:
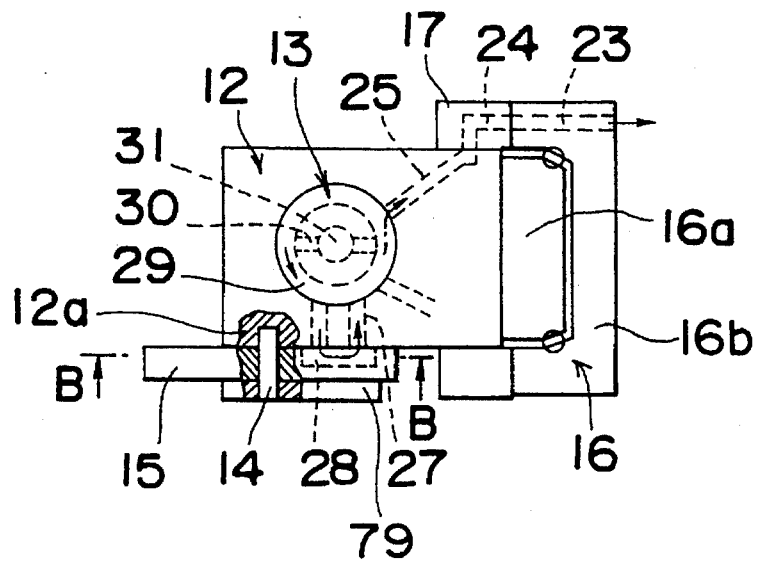
FIG. 7 is a partially sectional plan view of an air switching section of the apparatus in the preferred embodiment.

As indicated in FIGS. 4–6, groove-like air passages 24 communicated with the air passages 23 are elongated in the up-and-down direction in the air transmission plate 17. The air passages 24 are so designed as to be communicated with corresponding air passages 25 formed in the housing 12 even when the housing 12 is moved by the stroke S in the up-and-down direction. A negative pressure hole 27 facing the switching lever 15 is communicated with the air passage 25 via an air passage 26 formed annularly in the outer periphery of the rod 13.

Figure 8:
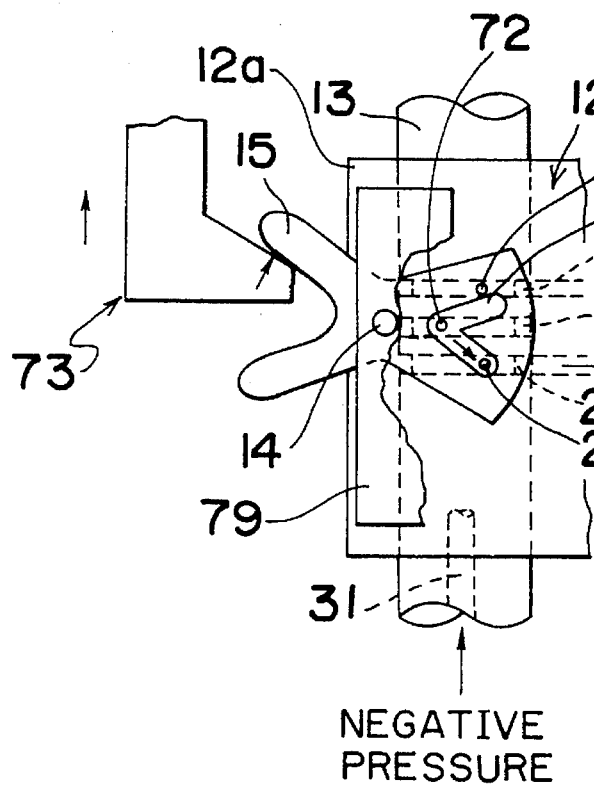
FIGS. 8 and 9 are sectional views taken along the line B—B of FIG. 7 showing different states during the switching operation.
Figure 9:
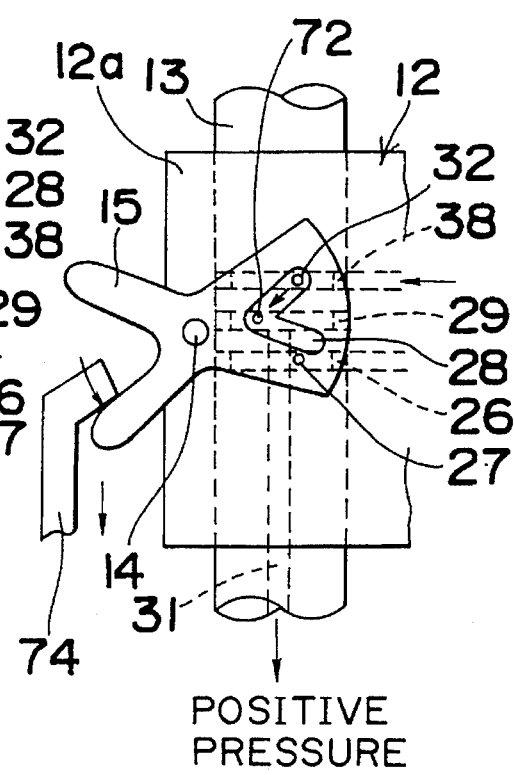

The switching lever 15 has a V-shaped air groove 28 as shown in FIGS. 1–3 and 7–9. The bent part of the air groove 28 is always connected, through a hole 72, to an air passage 29 similarly formed annularly in the outer periphery of the rod 13. At the same time, the V-shaped air groove 28 is adapted to be selectively switched, when the position of the switching lever 15 is changed, between the states where one end thereof is communicated with the negative pressure hole 27 (FIG. 8) and where the other end thereof is communicated with a positive pressure hole 32 (FIG. 9). The air passage 29 is communicated with the suction nozzle 6 through an air passage 31 passing through the axial center of the rod 13 and air passages 30 in the radial direction of the rod 13.

The flow of the air positive pressure air provided to the nozzle (i.e. during blowing) will now be depicted now. A pipe 33 connected to the air pressure source is located at a positive pressure blowing station (for example, from where the positive pressure air for mounting the component or the positive pressure air for cleaning the nozzle is conducted) from below the rotary table 18. The pipe 33 is communicable with an air passage 34 formed in the rotary table 18 in the radial direction corresponding to each mounting head 5. The air passage 34 is communicated, via an air passage 35 of the linear guide 16, an air passage 36 in the shape of an elongated groove in the air transmission plate 17, and an air passage 37 of the housing 12, with an annular air passage 38 of the rod 13 communicated with the positive pressure hole 32.

Figure 3:
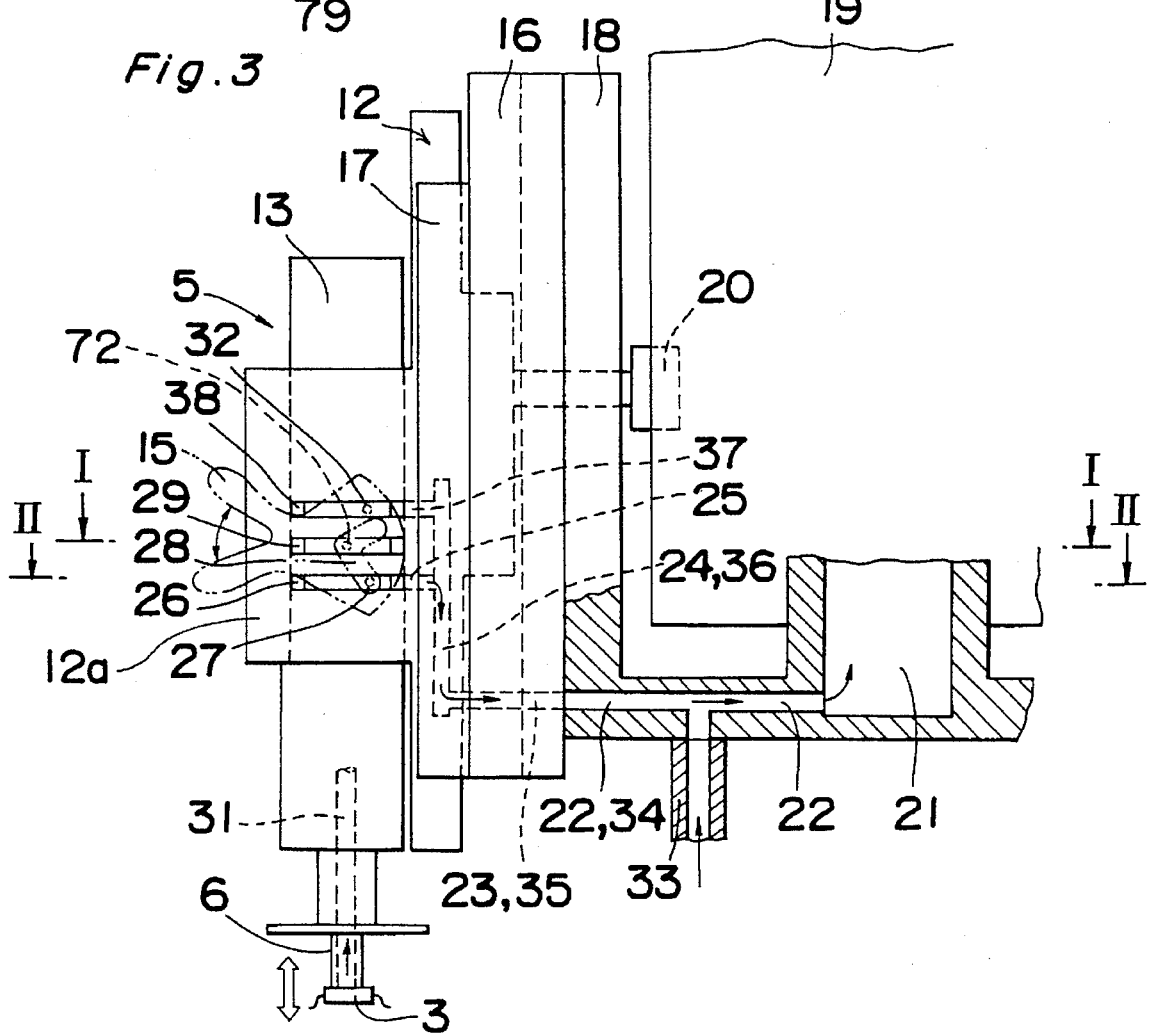
FIG. 3 is a partially sectional front view of the mounting means of FIGS. 1 and 2.
Figure 2:
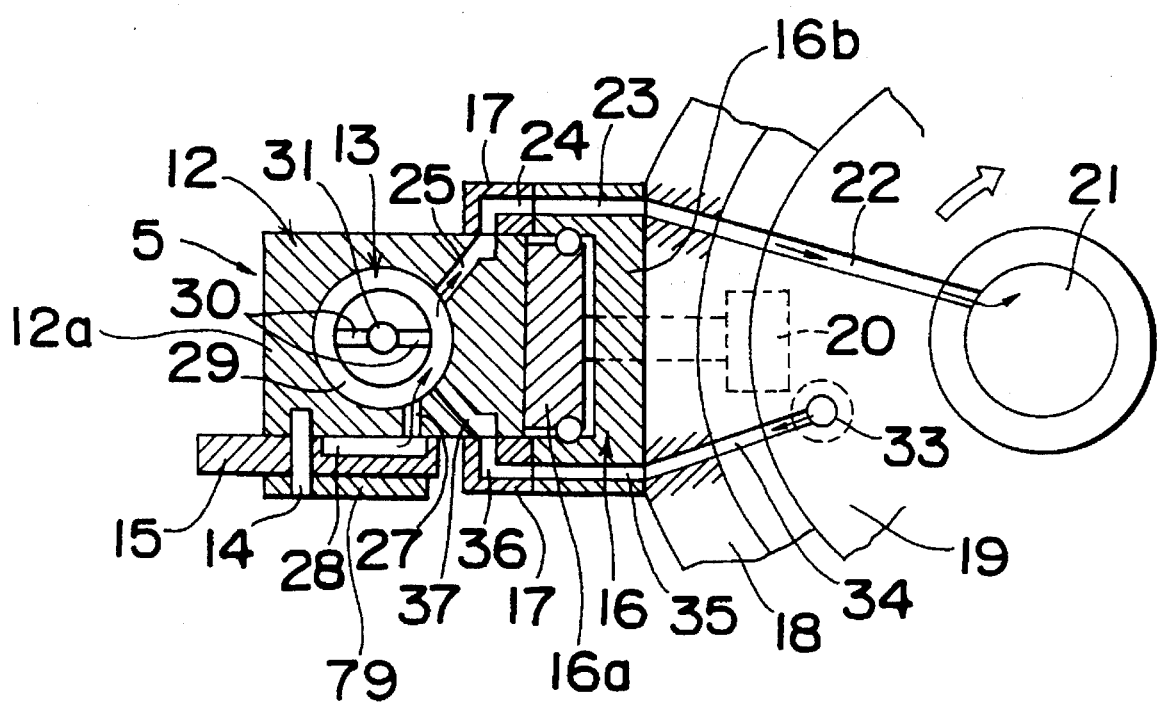

In the above-described constitution, when the switching lever 15 is rotated in the clockwise direction by the first lever 73 as shown by an arrow in FIG. 8, one end of the V-shaped air groove 28 is communicated with the negative pressure hole 27. In consequence, the suction nozzle 6 communicates with the bent part of the air groove 28 via the air passages 31, 30, and 29 and the hole 72 as shown in FIGS. 1 and 3, while the air groove 28 is communicated with the vacuum hole 21 via the negative pressure hole 27 and the air passages 26, 25, 24, 23, and 22 as shown in FIGS. 2 and 3. As a result, the suction nozzle 6 is maintains a vacuum at the front end thereof, thereby sucking the component 3.

On the other hand, when the switching lever 15 is rotated at the positive pressure blow station in the counterclockwise direction by the second lever 74 as shown by an arrow in FIG. 9, the other end of the V-shaped air groove 28 is communicated with the positive pressure hole 32. Since the suction nozzle 6 is held in the communicating state with the bent part of the air passage 28 as described before, and the air groove 28 is communicated with the pipe 33 connected with the air pressure source via the positive pressure hole 32 and the air passages 38, 37, 36, 35, and 34, the front end of the suction nozzle 6 is switched to having a positive pressure, whereby the component 3 is mounted or the clog of the suction nozzle 6 is blown out. The manner of communication between the air passages 25, 36, and 35 is similar to that between the air passages 25, 24, and 23 shown in FIGS. 4–6.

Although the linear guide 16 is a type of rolling guide in the above embodiment, a metallic bearing may be employed. If the housing 12 is constituted of a metallic bearing, the air transmission plate 17 may be removed and the air can be directly transmitted from the linear guide 16 to the housing 12.

As described hereinabove, since the air is supplied through the V-shaped air groove provided in the mounting means, it is not necessary to arrange air pipes outside the mounting means, so that the mounting means becomes compact in size and can be set at a narrow pitch relative to other of such mounting means. Accordingly, the moving distance of the mounting means is shortened, with the centrifugal force or the acceleration/deceleration impressed to the to-be-mounted components being reduced, thereby achieving high-speed and highly accurate mounting of the components. Moreover, since the air pipes are omitted, such problems as erroneous suction, etc. resulting from the breakage of the air pipes are eliminated, thus improving the mounting reliability.

Further, since the supply of the air is arranged to be switched at the air switching section through alignment of the air groove of the switching lever, the mounting means becomes compact and lightweight, and the components can be mounted highly accurately at high speeds.

Although the present invention has been fully described in connection with the preferred embodiment thereof with reference to the accompanying drawings, it is to be noted that various changes and modifications will be apparent to those skilled in the art. Such changes and modifications are to be understood as included within the scope of the present invention as defined by the appended claims unless they depart therefrom.

We claim:

1. A mounting apparatus for mounting electronic components on mounting members, said mounting apparatus comprising:

a component feeding section comprising a plurality of component feeding units for sequentially supplying electronic components to a predetermined component take-out position;

a positioning means for positioning mounting members in predetermined positions;

a mounting means for engaging one of the electronic components at said predetermined component take-out position and mounting the component on one of the mounting members;

wherein said mounting means comprises a vertically fixed part, a vertically movable member vertically movably mounted to said vertically fixed part for movement between a raised position and a lowered position, a rotary member mounted to said movable member for rotation about a vertical axis, and a suction nozzle mounted to said rotary member and having a suction passage;

wherein said rotary member has a gas passage arrangement therein in communication with said suction passage of said suction nozzle;

wherein said movable member has a gas passage arrangement therein in communication with said gas passage arrangement of said rotary member;

wherein said vertically fixed part has a gas passage arrangement therein in communication with said gas passage arrangement of said movable member and which is adapted for communication with a pressure source;

wherein said gas passage arrangement of said movable member includes a vertically elongated gas groove formed in an outer periphery of said movable member; and wherein said gas passage arrangement of said vertically fixed part includes a vertically elongated gas groove formed in an outer periphery of said vertically fixed part, said vertically elongated gas groove of said vertically fixed part being in communication with said vertically elongated gas groove of said movable member in both the raised and lowered positions of said movable member relative to said vertically fixed part.

2. A mounting apparatus for mounting electronic components on mounting members, said mounting apparatus comprising a mounting means for engaging one of the electronic components at a predetermined component take-out position and mounting the component on one of the mounting members, said mounting means comprising:

a vertically fixed part;

a vertically movable member vertically movably mounted to said vertically fixed part for movement between a raised position and a lowered position;

a rotary member mounted to said movable member for rotation about a vertical axis; and a suction nozzle mounted to said rotary member and having a suction passage;

wherein said rotary member has a gas passage arrangement therein in communication with said suction passage of said suction nozzle;

wherein said movable member has a gas passage arrangement therein in communication with said gas passage arrangement of said rotary member;

wherein said vertically fixed part has a gas passage arrangement therein in communication with said gas passage arrangement of said movable member and which is adapted for communication with a pressure source;

wherein said gas passage arrangement of said movable member includes a vertically elongated gas groove formed in an outer periphery of said movable member; and wherein said gas passage arrangement of said vertically fixed part includes a vertically elongated gas groove formed in an outer periphery of said vertically fixed part, said vertically elongated gas groove of said vertically fixed part being in communication with said vertically elongated gas groove of said movable member both the raised and lowered positions of said movable member relative to said vertically fixed part.

3. A mounting apparatus for mounting electronic components on mounting members, said mounting apparatus comprising:

a component feeding section comprising a plurality of component feeding units for sequentially supplying electronic components to a predetermined component take-out position;

a positioning means for positioning mounting members in predetermined positions;

a mounting means for engaging one of the electronic components at said predetermined component take-out position and mounting the component on one of the mounting members;

wherein said mounting means comprises a nozzle having a gas pressure passage therein and being movable between a raised position and a lowered position, a gas pressure transmitting member having a first gas pressure passage arrangement therein in communication with said gas pressure passage of said nozzle and a second gas pressure passage arrangement therein which includes a negative pressure hole adapted to communicate with a negative pressure source and a positive pressure hole adapted to communicate with a positive pressure source, and a gas switching member movably mounted to said gas pressure transmitting member for movement between first and second positions;

wherein said switching member comprises means for communicating said first gas pressure passage arrangement and said gas pressure passage of said nozzle with said negative pressure hole when said nozzle is moved to said raised position and said switching member is moved to said first position, and for communicating said first gas pressure passage arrangement and said gas pressure passage of said nozzle with said positive pressure hole when said nozzle is moved to said lowered position and said switching member is moved to said second position.

4. A mounting apparatus as recited in claim 3, wherein said gas pressure transmitting member comprises a vertically fixed part and a vertically movable member vertically movably mounted to said vertically fixed part.

5. A mounting apparatus as recited in claim 4, wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

6. A mounting apparatus as recited in claim 3, wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

7. A mounting apparatus for mounting electronic components on mounting members, said mounting apparatus comprising a mounting means for engaging one of the electronic components at a predetermined component take-out position and mounting the component on one of the mounting members, said mounting means comprising:

a nozzle having a gas pressure passage therein and being movable between a raised position and a lowered position;

a gas pressure transmitting member having a first gas pressure passage arrangement therein in communication with said gas pressure passage of said nozzle and a second gas pressure passage arrangement therein which includes a negative pressure hole adapted to communicate with a negative pressure source and a positive pressure hole adapted to communicate with a positive pressure source;

a gas switching member movably mounted to said gas pressure transmitting member for movement between first and second positions; and wherein said switching member comprises means for communicating said first gas pressure passage arrangement and said gas pressure passage of said nozzle with said negative pressure hole when said nozzle is moved to said raised position and said switching member is moved to said first position, and for communicating said first gas pressure passage arrangement and said gas pressure passage of said nozzle with said positive pressure hole when said nozzle is moved to said lowered position and said switching member is moved to said second position.

8. A mounting apparatus as recited in claim 7, wherein said gas pressure transmitting member comprises a vertically fixed part and a vertically movable member vertically movably mounted to said vertically fixed part.

9. A mounting apparatus as recited in claim 8, wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

10. A mounting apparatus as recited in claim 7, wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

11. A mounting apparatus for mounting electronic components on mounting members, said mounting apparatus comprising:

a component feeding section comprising a plurality of component feeding units for sequentially supplying electronic components to a predetermined component take-out position;

a positioning means for positioning mounting members in predetermined positions;

a mounting means for engaging one of the electronic components at said predetermined component take-out position and mounting the component on one of the mounting members;

wherein said mounting means comprises a nozzle having a gas pressure passage therein and being movable between a raised position and a lowered position, a gas pressure transmitting member having a first gas pressure passage arrangement therein in communication with said gas pressure passage of said nozzle and a second gas pressure passage arrangement therein which includes a negative pressure hole adapted to communicate with a negative pressure source and a positive pressure hole adapted to communicate with a positive pressure source, and a gas switching member movably mounted to said gas pressure transmitting member for movement between first and second positions;

wherein said switching member comprises means for communicating said first gas pressure passage arrangement and said gas pressure passage of said nozzle with said negative pressure hole when said switching member is moved to said first position, and for communicating said first gas pressure passage arrangement and said gas pressure passage of said nozzle with said positive pressure hole when said switching member is moved to said second position;

wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

12. A mounting apparatus for mounting electronic components on mounting members, said mounting apparatus comprising a mounting means for engaging one of the electronic components at a predetermined component takeout position and mounting the component on one of the mounting members, said mounting means comprising:

a nozzle having a gas pressure passage therein and being movable between a raised position and a lowered position;

a gas pressure transmitting member having a first gas pressure passage arrangement therein in communication with said gas pressure passage of said nozzle and a second gas pressure passage arrangement therein which includes a negative pressure hole adapted to communicate with a negative pressure source and a positive pressure hole adapted to communicate with a positive pressure source;

a gas switching member movably mounted to said gas pressure transmitting member for movement between first and second positions;

wherein said switching member comprises means for communicating said first gas pressure passage arrangement and said gas pressure passage of said nozzle with said negative pressure hole when said switching member is moved to said first position, and for communicating said first gas pressure passage arrangement and said gas pressure passage of said nozzle with said positive pressure hole when said switching member is moved to said second position;

wherein said switching member has a gas groove formed therein which is always in communication with said first gas pressure passage arrangement, which is in communication with said negative pressure hole when said switching member is in said first position and which is in communication with said positive pressure hole when said switching member is in said second position; and said gas groove of said switching member comprises a V-shaped groove including a bent part and two end parts, said bent part being in communication with said first gas pressure passage arrangement and said gas pressure passage of said nozzle, one of said end parts being in communication with said negative pressure hole when said switching member is in said first position and the other of said end parts being in communication with said positive pressure hole when said switching member is in said second position.

\* \* \* \* \*